United States Patent
Nulsen et al.

(10) Patent No.: US 7,414,438 B1
(45) Date of Patent: Aug. 19, 2008

(54) CLOCK BASED VOLTAGE DEVIATION DETECTOR

(75) Inventors: Thomas Nulsen, Hollister, CA (US); Jose Rosado, San Jose, CA (US); Robert Glenn, San Jose, CA (US)

(73) Assignee: Credence Systems Corporation, Milpitas, CA (US)

( * ) Notice: Subject to any disclaimer, the term of this patent is extended or adjusted under 35 U.S.C. 154(b) by 0 days.

(21) Appl. No.: 10/803,340

(22) Filed: Mar. 17, 2004

Related U.S. Application Data

(60) Provisional application No. 60/529,381, filed on Dec. 11, 2003.

(51) Int. Cl.
*H03K 5/19* (2006.01)

(52) U.S. Cl. .............................. 327/18; 327/19; 327/20; 327/21; 327/22; 327/23; 327/24; 327/25; 327/26; 324/76.25; 324/76.52

(58) Field of Classification Search ........................ None
See application file for complete search history.

(56) References Cited

U.S. PATENT DOCUMENTS

| | | | | |
|---|---|---|---|---|
| 5,444,744 A | * | 8/1995 | Yamamoto et al. | 375/376 |
| 5,739,708 A | * | 4/1998 | LeWalter | 327/143 |
| 5,774,004 A | * | 6/1998 | Peng | 327/205 |
| 5,825,321 A | * | 10/1998 | Park | 341/144 |
| 6,153,945 A | * | 11/2000 | Koss et al. | 307/10.1 |
| 6,335,641 B1 | * | 1/2002 | Tougou | 327/73 |
| 6,486,645 B1 | * | 11/2002 | Van Auken | 323/287 |
| 6,664,908 B2 | * | 12/2003 | Sundquist et al. | 341/143 |
| 6,885,331 B2 | * | 4/2005 | Krymski | 341/169 |
| 2002/0050838 A1 | * | 5/2002 | Kim et al. | 326/30 |

* cited by examiner

*Primary Examiner*—Hiep Nguyen

(57) ABSTRACT

The clock based voltage deviation detector of the present invention includes a pulse module, an indicator module and a correlation module. The pulse module generates a stream of reset pulses as a function of a clock signal. The indicator module generates a pass/fail indicator signal as a function of the reset pulse stream and a difference between an input signal and a reference voltage. The correlation module correlates an event (e.g., overvoltage or undervoltage) of the pass/fail indicator signal with a period of the clock signal at which the event occurred.

12 Claims, 7 Drawing Sheets

CLOCK BASED VOLTAGE DEVIATION DETECTOR

CROSS-REFERENCE TO RELATED APPLICATION

This application claims the benefit of U.S. Provisional Application No. 60/529,381 filed Dec. 11, 2003.

BACKGROUND OF THE INVENTION

In the conventional art, comparators are utilized to monitor an input voltage. Referring to FIG. 1A, an exemplary comparator in accordance with the convention art is shown. The comparator compares the input voltage ($V_I$) with a reference level ($V_R$). The reference voltage constitutes the comparator threshold. The comparator outputs an output voltage ($V_O$) as a function of the relative difference between the input voltage ($V_I$) and the reference voltage level ($V_R$). The transfer characteristics of the exemplary comparator is shown in FIG. 1B. If the input voltage ($V_I$) is greater than the reference voltage ($V_R$) the comparator provides an output signal having a first state ($L_+$) (e.g., high state). Alternatively, if the input voltage ($V_I$) is less than the reference voltage ($V_R$) the comparator provides an output signal having a second state ($L_-$) (e.g., low state).

However, prior art comparators are disadvantageous because an input voltage event (e.g., overvoltage or undervoltage event) is not correlated with the time the event occurred. For example, although a comparator determines that the monitored input voltage exceeded a maximum voltage limit during a test sequence, the automatic test equipment performing the test, due to its periodic nature, is unable to determine from the comparator at what time during the test the overvoltage event(s) occurred.

SUMMARY OF THE INVENTION

A clock based deviation detector is disclosed. In one embodiment, the clock based voltage deviation detector includes a pulse module, an indicator module and a correlation module. The pulse module generates a stream of reset pulses as a function of a clock signal. The indicator module generates a pass/fail indicator signal as a function of the reset pulse stream and a difference between an input signal and a reference voltage. The correlation module correlates an event (e.g., overvoltage or undervoltage) of the pass/fail indicator signal with a period of the clock signal at which the event occurred.

BRIEF DESCRIPTION OF THE DRAWINGS

The present invention is illustrated by way of example and not by way of limitation, in the figures of the accompanying drawings and in which like reference numerals refer to similar elements and in which.

DETAILED DESCRIPTION OF THE INVENTION

Reference will now be made in detail to the embodiments of the invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it is understood that the present invention may be practiced without these specific details. In other instances, well-known methods, procedures, components, and circuits have not been described in detail as not to unnecessarily obscure aspects of the present invention.

Figure 1A:
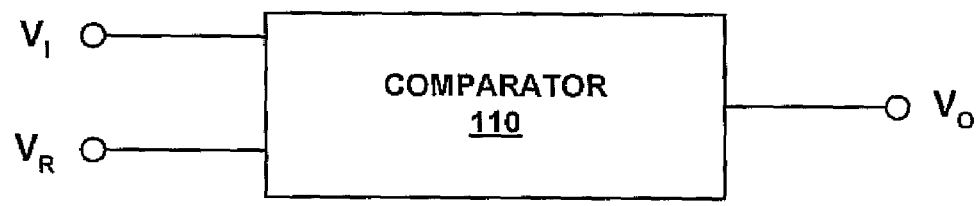
FIG. 1A shows an exemplary comparator in accordance with the convention art.
Figure 1B:
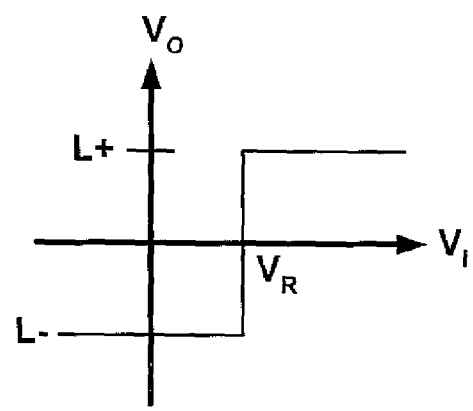
FIG. 1B, shows the transfer characteristics of the exemplary comparator in accordance with the conventional art.
Figure 2A:
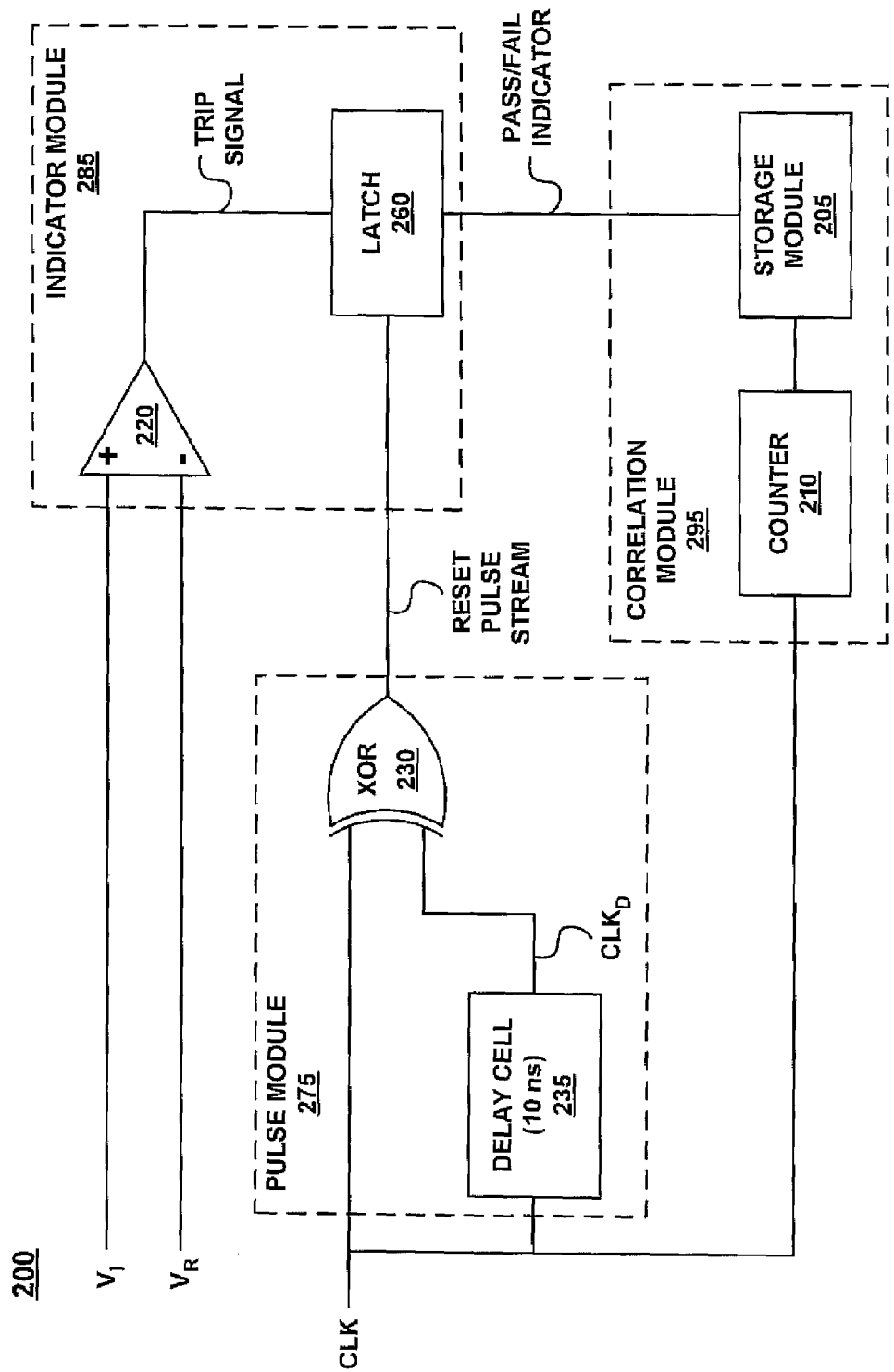
FIG. 2A shows a block diagram of a clock based voltage deviation detector, in accordance with one embodiment of the present invention.

Referring now to FIG. 2A, a block diagram of a clock based voltage deviation detector 200, in accordance with one embodiment of the present invention, is shown. The present clock based voltage deviation detector 200 illustrates implementation of an overvoltage detector. As depicted in FIG. 2A, the clock based voltage deviation detector 200 includes a pulse module 275, an indicator module 285 and a correlation module 295. The pulse module 275 generates a stream of reset pulses as a function of a clock signal. The indicator module 285 generates a pass/fail indicator signal as a function of the reset pulse stream and a difference between an input signal and a reference voltage. The correlation module 295 correlates an event (e.g., overvoltage or undervoltage) of the pass/fail indicator signal with a period of the clock signal at which the event occurred.

In one embodiment, the pulse module 275 includes a delay cell 235 and an eXclusive-OR (XOR) gate 230. The indicator module 285 includes a comparator 220 and a latch 260. Alternatively, the indicator module 285 may include a latch-enabled comparator in place of the separate comparator and latch elements. The correlation module 295 includes a counter 210 and a storage module 205.

The delay cell 235 includes an input for receiving a clock signal (CLK). The delay cell 235 introduces a small time delay to generate a delayed clock signal ($CLK_D$) at an output of the delay cell 235. The delay cell 235 may be one or more logic gates, a resistor-capacitor circuit or the like. In an exemplary implementation, the delay cell 235 introduces a time delay of approximately 10 ns.

The XOR gate 230 includes a first input for receiving the clock signal (CLK) and a second input for receiving the delayed clock signal ($CLK_D$). The output of the XOR gate 230 is low if both input signals are high or low. The output of the XOR gate 230 is high if one input signal is high and the other input signal is low. Thus, the output of the XOR gate 230 is a series of pulses aligned to the rising and falling edge of the clock signal (CLK). The width of each reset pulse is substantially equal to the time delay through the delay cell 235.

The comparator 220 includes a first input (e.g., non-inverting) for receiving an input voltage ($V_I$) to be monitored, a second input (e.g., inverting) for receiving a reference voltage ($V_R$) level (e.g., threshold level). The output of the comparator 220 is at a first state (e.g., low state) if the monitored voltage ($V_I$) is less than the reference voltage ($V_R$) and is at a second state (e.g., high state) if the monitored voltage ($V_I$) is greater than the reference voltage ($V_R$). Thus, a trip signal (e.g., the monitored voltage $V_I$ is above or below the reference voltage $V_R$) is generated at an output of the comparator 220.

The latch 260 includes a first input for receiving the trip signal and a second input for receiving the stream of reset pulses. When the output of the comparator 220 transitions from the first state to the second state, the output of the latch 260 transitions from a first state (e.g., low state) to a second state (e.g., high state) and is held at the second state until the latch 260 is reset by the next pulse of the reset pulse stream. Thus, a pass/fail indicator is generated at an output of the latch 260.

The counter 210 includes a first input for receiving the clock signal (CLK). A count value representing a period of time is generated at an output of the counter 210. It is also appreciated that the counter 210 may instead receive the reset pulse stream at its input. By counting the pulses of the reset pulse stream, the resolution of the clock based voltage deviation detector 200 may be doubled. The storage module 205 includes a first input for receiving the count and a second input for receiving the pass/fail indicator. The storage module 205 stores the count whenever a fail indicator (e.g., high state) is received.

Accordingly, the clock based voltage deviation detector 200 correlates an overvoltage event with a particular clock cycle. The clock based voltage deviation detector 200 may advantageously be utilized in control systems, test equipment and/or the like. For example, the clock based voltage deviation detector 200 may be utilized to monitor voltage levels presented to an automatic test equipment (ATE) by a device under test (DUT) to verify that a maximum or minimum voltage level has not been exceeded at any time during the testing process. The count value of the particular clock cycle(s) at which any overvoltage or undervoltage event occurred may be stored in the storage module 205. The count value may then be retrieved and processed as part of fault analysis performed by the ATE or user.

Figure 2B:
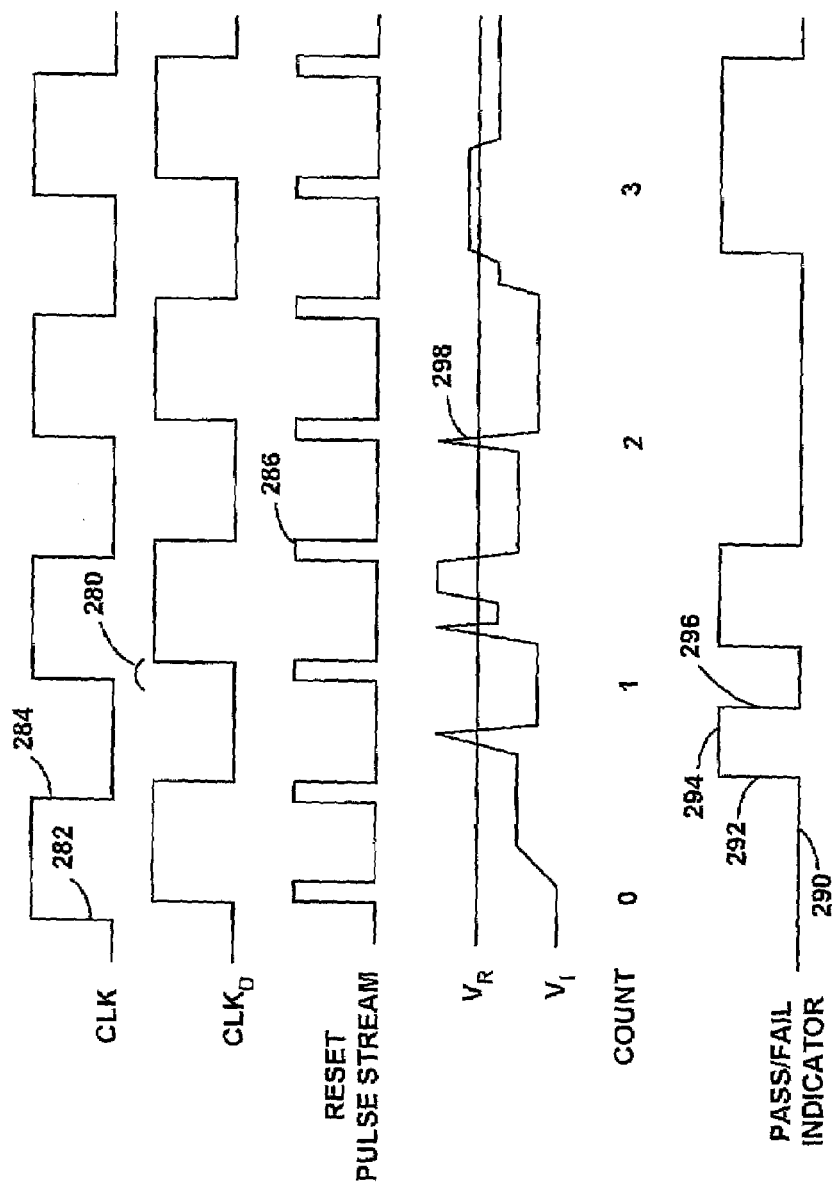
FIG. 2B shows a timing diagram illustrating operation of a clock based voltage deviation detector, in accordance with one embodiment of the present invention.

Referring now to FIG. 2B, a timing diagram illustrating operation of a clock based voltage deviation detector 200, in accordance with one embodiment of the present invention, is shown. As depicted in FIG. 2B, the delayed clock signal ($CLK_D$) is shifted in time 280 with respect to the clock signal (CLK). The reset pulse stream is a series of pulses substantially aligned to the rising and falling edge 282, 284 of the clock signal ($CLK_D$). The width of each reset pulse 286 is substantially equal to the shift in time 280 between the clock signal (CLK) and the delayed clock signal ($CLK_D$). The pass/fail indicator is at a first state 290 if the monitored voltage ($V_I$) is less than the reference voltage ($V_R$). The pass/fail indicator transitions 292 to a second state 294 when the monitored voltage ($V_I$) exceeds the reference voltage ($V_R$). The second state 294 is maintained (e.g., latched) until the monitored voltage ($V_I$) falls below the reference voltage ($V_R$) and a next result pulse is detected. If the monitored voltage ($V_I$) falls below the reference voltage ($V_R$), the pass/fail indicator transitions 296 to the first state 290 after the next reset pulse.

An overvoltage event 298, however, may not be detected if it occurs during a reset pulse. One solution is to make the width of the reset pulse (e.g., time delay introduced by the delay cell) relatively small as compared to the period of overvoltage events. Another solution is to utilize one or more additional comparator/latch circuits wherein each latch receives a reset pulse stream that is shifted in time with respect to the reset pulse stream received by the other latches. The output of the plurality of comparators may then be summed to generate the pass/fail indicator.

Figure 3A:
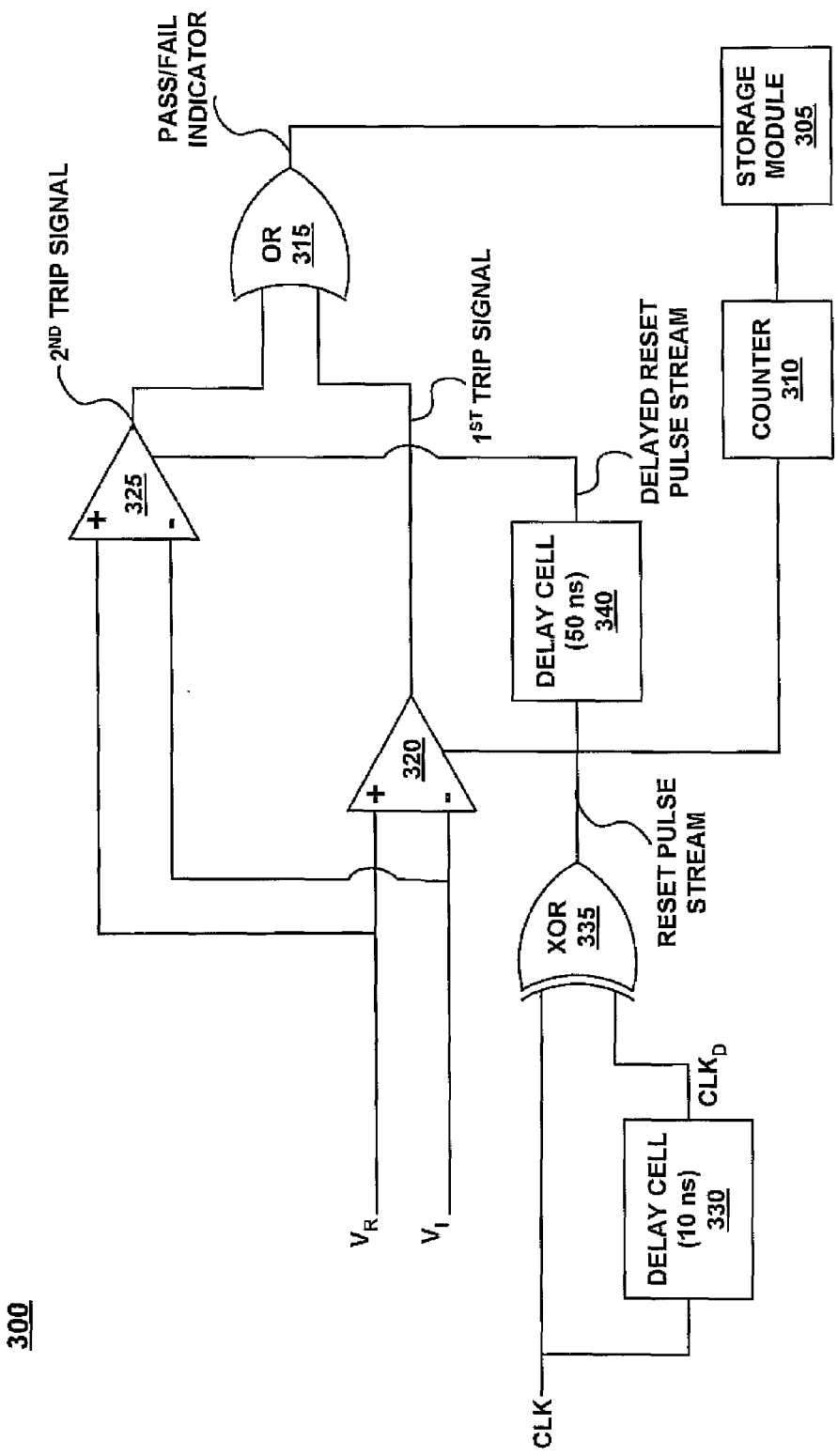
FIG. 3A shows a block diagram of a clock based voltage deviation detector, in accordance with one embodiment of the present invention.

Referring now to FIG. 3A, a block diagram of a clock based voltage deviation detector 300, in accordance with one embodiment of the present invention, is shown. The present clock based voltage deviation detector 300 illustrates implementation of an undervoltage detector. As depicted in FIG. 3A, the clock based voltage deviation detector 300 includes a pulse module, an indicator module and a correlation module. The pulse module generates a stream of reset pulses as a function of a clock signal (CLK). The pulse module may further generate a stream of delayed reset pulses as a function of the clock signal (CLK). The indicator module generates a pass/fail indicator signal as a function of the reset pulse stream and a difference between an input signal ($V_I$) and a reference voltage ($V_R$). The indicator may further generate the pass/fail indicator signal as a function of the stream of delayed reset pulses. The correlation module correlates an event (e.g., overvoltage or undervoltage) of the pass/fail indicator signal with a period of the clock signal at which the event occurred.

In one embodiment, the pulse module includes a first delay cell 330, an eXclusive-OR (XOR) gate 335, and a second delay cell 340. The indicator module includes a first latch-enabled comparator 320, a second latch-enabled comparator 325, and an OR gate 315. In one implementation, the latch-enabled comparators 320, 325 may be LT1016 comparators with internal latch manufactured by Linear Technology of Milpitas, Calif. The correlation module includes a counter 310 and a storage module 305.

The first delay cell 330 includes an input for receiving a clock signal (CLK). The first delay cell 330 introduces a first time delay (e.g., 10 ns) to generate the delayed clock signal ($CLK_D$) at its output. The first delay cell 330 may be one or more logic gates, a resistor-capacitor circuit or the like. The XOR gate 335 includes a first input for receiving the clock signal (CLK) and a second input for receiving the delayed clock signal ($CLK_D$). The output of the XOR gate 335 is low if both input signals are high or low at the same time. The output of the XOR gate 335 is high if one input signal is high and the other input signal is low. Thus, the XOR gate 335 generates a stream of reset pulses, wherein the pulses are aligned to the rising and falling edge of the clock signal (CLK). The width of each pulse is substantially equal to the first time delay.

The first latch-enabled comparator 320 includes a first input (e.g., inverting) for receiving an input voltage ($V_I$) to be monitored, a second input (e.g., non-inverting) for receiving a reference voltage ($V_R$) (e.g., threshold level) and a third input (e.g., latch enable) for receiving the stream of reset pulses. The output of the first latch-enabled comparator is at a first state (e.g., low state) if the monitored voltage ($V_I$) is more than the reference voltage ($V_R$). The output of the first latch-enabled comparator 320 transitions from the first state to a second state (e.g., high state) when the monitored voltage ($V_I$) falls below the reference voltage ($V_R$). The first latch-enabled comparator 320 latches (e.g., holds) the output at the second state until receipt of the next reset pulse. If the monitored voltage ($V_I$) rises above the reference voltage ($V_R$) before receipt of the next reset pulse, the output of the first latch-enabled comparator 320 transitions back to the first state. Thus, a first trip signal is generated at an output of the first latch-enabled comparator 320.

The second delay cell 340 includes an input for receiving the stream of reset pulses. The second delay cell 340 introduces a second time delay (e.g., 50 ns) to generate a stream of delayed reset pulses at its output. The second delay cell 340 may be one or more logic gates, a resistor-capacitor circuit or the like. Each pulse of the delayed reset pulse stream is delayed with respect to a corresponding pulse of the reset pulse stream by approximately the second time delay.

The second latch-enabled comparator 325 includes a first input (e.g., inverting) for receiving the input voltage ($V_I$) to be monitored, a second input (e.g., non-inverting) for receiving the reference voltage ($V_R$) and a third input (e.g., latch enable) for receiving the delayed reset pulse stream. The output of the second latch-enabled comparator 325 is at a first state (e.g., low state) if the monitored voltage ($V_I$) is more than the reference voltage ($V_R$). The output of the second latch-enabled comparator 325 transitions from the first state to a second state (e.g., high state) when the monitored voltage ($V_I$) falls below the reference voltage ($V_R$). The second latch-enabled comparator 325 latches (e.g., holds) the output at the second state until receipt of the next reset pulse. If the monitored voltage ($V_I$) rises above the reference voltage ($V_R$) before receipt of the next reset pulse, the output of the second latch-enabled comparator 325 transitions back to the first state upon receipt of the next reset pulse. Thus, a second trip signal is generated at an output of the second comparator 325.

The OR gate 315 includes a first input for receiving the first trip signal and a second input for receiving the second trip signal. The output of the OR gate 315 is low if both the first and second trips signals are low. The output of the OR gate 315 is high if one or both of the first and second trip signals are high. Thus, a pass/fail indicator signal is generated at an output of the OR gate 315. By summing the first and second trip signals to generate the pass/fail indicator, an undervoltage event is detected even if it occurs during a reset pulse of the first or second reset pulse stream. For example, if an undervoltage event occurs during a reset pulse of the reset pulse stream, the first latch-enabled comparator 320 will not detect the event. However, each pulse in the delayed reset pulse stream is delayed (e.g., 50 ns) with respect to the corresponding pulse of the reset pulse stream. Therefore, the second latch-enabled comparator 325 will detect the undervoltage event and latch its output at the second state, which in turn will result in a high output at the OR gate 315.

The counter 310 includes a first input for receiving the reset pulse stream. A count value representing a period of time is generated at an output of the counter 310. It is also appreciated that the counter 310 may instead receive the clock signal at its input. By counting the pulses of the reset pulse stream, the resolution of the clock based voltage deviation detector 300 may be doubled. The storage module 305 includes a first input for receiving the count and a second input for receiving the pass/fail indicator. The storage module 305 stores the count whenever a fail indicator (e.g., high state) is received. Accordingly, the clock based voltage deviation detector 300 correlates an overvoltage event with a particular clock cycle.

Figure 3B:
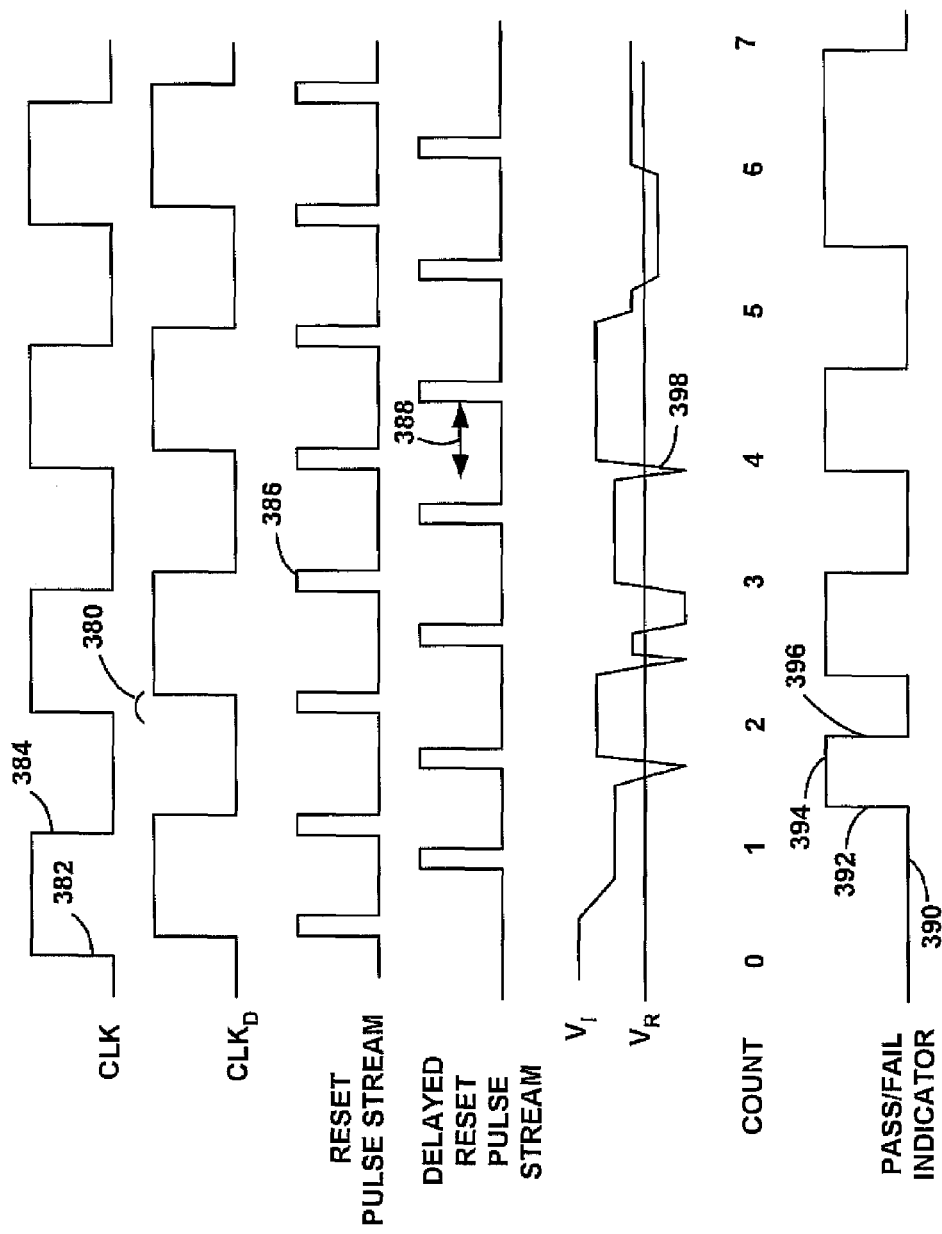

Referring now to FIG. 3B, a timing diagram illustrating operation of a clock based voltage deviation detector, in accordance with one embodiment of the present invention, is shown. As depicted in FIG. 3B the delayed clock signal ($CLK_D$) is shifted in time 380 with respect to the clock signal (CLK). The reset pulse stream is a series of pulses substantially aligned to the rising and falling edge 382, 384 of the clock signal (CLK). The width of each reset pulse 386 is substantially equal to the shift in time 380 between the clock signal (CLK) and the delayed clock signal ($CLK_D$). The delayed reset pulse stream is shifted in time 388 with respect to the reset pulse stream. The pass/fail indicator is at a first state 390 if the monitored voltage ($V_I$) is greater than the reference voltage ($V_R$). The pass/fail indicator transitions 392 to a second state 394 when the monitored voltage ($V_I$) falls below the reference voltage ($V_R$). The second state 394 is maintained (e.g., latched) until the monitored voltage ($V_I$) rises above the reference voltage ($V_R$) and a next result pulse or delayed reset pulse is detected. If the monitored voltage ($V_I$) rises above the reference voltage ($V_R$), the pass/fail indicator transitions 396 to the first state 390 after the next reset pulse or delayed reset pulse. It is appreciated that the second latch-enabled comparator detects an undervoltage 398 event that occurs during a reset pulse; while the first latch-enabled comparator detects an undervoltage event that occurs during a delayed reset pulse.

Figure 4A:
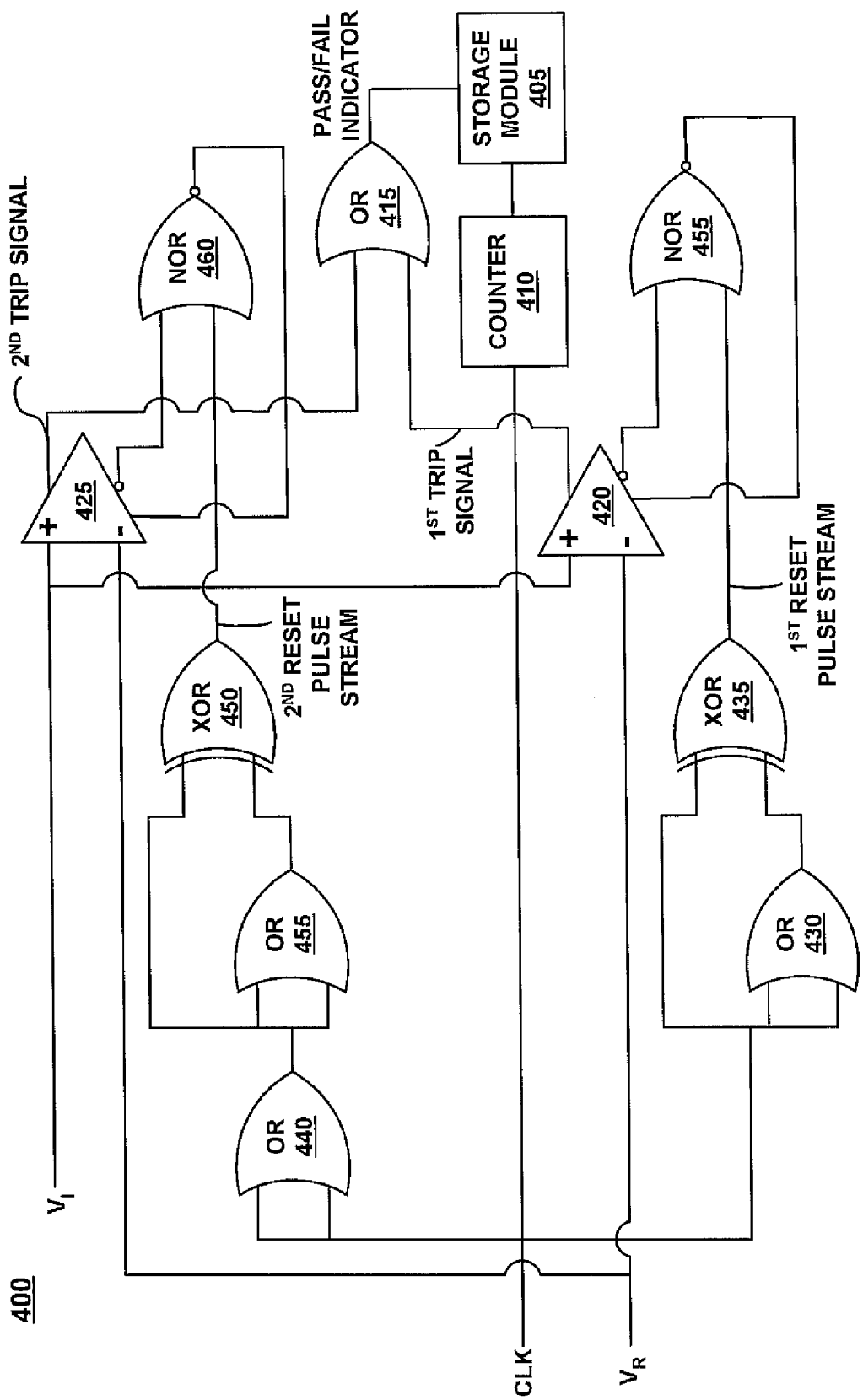
FIG. 4A shows a block diagram of a clock based voltage deviation detector, in accordance with one embodiment of the present invention.

Referring now to FIG. 4A, a block diagram of a clock based voltage deviation detector 400, in accordance with one embodiment of the present invention, is shown. The present clock based voltage deviation detector 400 illustrates the implementation of an overvoltage detector. As depicted in FIG. 4A, the clock based voltage deviation detector 400 includes a storage module 405, a counter 410, a first pulse generator, a second pulse generator, a first trip detector circuit, a second trip detector circuit and a summing circuit.

The first pulse generator includes a first OR gate 430 and a first exclusive-or (XOR) gate 435. The first OR gate 430 includes a plurality of inputs for receiving a clock signal (CLK). The first OR gate 430 is utilized to generate a first delayed clock signal at the output of the OR gate 430, by introducing a first time delay (e.g., 10 ns signal propagation delay). The first XOR gate 435 includes a first input for receiving the clock signal (CLK) and a second input that is communicatively coupled to the output of the first OR gate 430. The output of the first XOR gate 435 is low if both the clock signal (CLK) and the first delayed clock signal are high or low at the same time. The output of the first XOR gate 435 is high if the clock signal or the first delayed clock signal is high and the other is low at the same time. Thus, a first stream of reset pulses is generated at the output of the first XOR gate 435. The first stream of reset pulses are aligned to the rising edge of the clock signal (CLK) and have a pulse width substantially equal to the first time delay.

The second pulse generator includes a second OR gate 440, a third OR gate 445 and a second XOR gate 450. The second OR gate 440 includes a plurality of inputs for receiving the clock signal (CLK). The second OR gate 440 is utilized to generate a second delayed clock signal, by introducing a second time delay (e.g., 50 ns signal propagation delay). Although shown as a single OR gate, it is appreciated that the second OR gate 440 may comprise a plurality of cascaded OR gates in order to achieve the desired second time delay. The third OR gate 445 includes a plurality of inputs that are communicatively coupled to the output of the second OR gate 440. The third OR gate 445 is utilized to generate a third delayed clock signal, by introducing a third time delay (e.g., 10 ns signal propagation delay). The second XOR gate 450 includes a first input communicatively coupled to the output of the second OR gate 440 and a second input that is communicatively coupled to the output of the third OR gate 445. The output of the second XOR gate 450 is low if the outputs of the second OR gate 440 and the third OR gate 445 are both high or both low at the same time. The output of the second XOR gate 450 is high if the output of the second OR gate 440 or the output of the second OR gate is high and the other is low at the same time. Thus, a second stream of reset pulses is generated at the output of the second XOR gate 450. The second stream of reset pulses are delayed by the second time delay with respect to the rising edge of the clock signal (CLK) and have a pulse width substantially equal to the third time delay.

The first trip detector circuit includes a first latch-enabled comparator 420 and a first Not-OR (NOR) gate 455. The first latch-enabled comparator circuit 420 includes a non-inverting input for receiving an input voltage ($V_I$) to be monitored and an inverting input for receiving a reference voltage ($V_R$) (e.g., threshold level). The first NOR gate 455 includes a first input communicatively coupled to the inverted output of the first latch-enabled comparator 420 and a second input for receiving the first reset pulse stream. The output of the first NOR gate 455 is communicatively coupled to the latch enable input of the first latch-enabled comparator circuit 420.

The non-inverted output of the latch-enabled comparator 420 is low if the input voltage ($V_I$) is less than the reference voltage ($V_R$). The inverted output of the latch-enabled comparator 420 is high if the input voltage ($V_I$) is less than the reference voltage ($V_R$). The output of the first NOR gate 455 is low when the inverted output of the latch-enabled comparator 420 is high. Accordingly, the non-inverted output and the inverted output of the latch-enabled comparator 420 are not latched.

When the input voltage ($V_I$) rises above the reference voltage ($V_R$), the non-inverted output of the latch-enabled comparator 420 is driven high and the inverted output of is driven low. The output of the first NOR gate 455 goes high until the next reset pulse of the first reset pulse stream is received at the input of the first NOR gate 455. Accordingly, the non-inverted output of the first latch-enabled comparator 420 is latch high and the inverted output is latched low until the next reset pulse is received. If the input voltage ($V_I$) remains above the reference voltage ($V_R$) upon receipt of the next reset pulse, the non-inverted output of the latch-enabled comparator 420 remains high and the inverted output remains low. If the input voltage ($V_I$) has dropped below the reference voltage ($V_R$) prior to receipt of the next reset pulse, the non-inverted output of the latch-enabled comparator 420 is driven low and the inverted output is driven high upon receipt of the next reset pulse of the first reset pulse stream.

The second trip detector circuit includes a second latch-enabled comparator 425 and a second NOR gate 460. The second latch-enabled comparator 425 includes a non-inverting input for receiving the input voltage ($V_I$) to be monitored and an inverting input for receiving the reference voltage ($V_R$). The second NOR gate 460 includes a first input communicatively coupled to the inverted output of the second latch-enabled comparator 425 and a second input for receiving the second reset pulse stream. The output of the second NOR gate 460 is communicatively coupled to the latch input of the second latch-enabled comparator 425.

The non-inverted output of the second latch-enabled comparator 425 is low if the input voltage ($V_I$) is less than the reference voltage ($V_R$). The inverted output of the second latch-enabled comparator 460 is high if the input voltage ($V_I$) is less than the reference voltage ($V_R$). The output of the second NOR gate 460 is low when the inverted output of the second latch-enabled comparator 425 is high. Accordingly, the non-inverted output and the inverted output of the second latch-enabled comparator 425 are not latched.

When the input voltage ($V_I$) rises above the reference voltage ($V_R$), the non-inverted output of the second latch-enabled comparator 425 is driven high and the inverted output is driven low. The output of the second NOR gate 460 goes high until the next reset pulse of the second reset pulse stream is received at the input of the second NOR gate 460. Accordingly, the non-inverted output of the second latch-enabled comparator 420 is latched high and the inverted output is latched low until the next reset pulse is received. If the input voltage ($V_I$) remains above the reference voltage ($V_R$) upon receipt of the next reset pulse, the non-inverted output of the second latch-enabled comparator 425 remains high and the inverted output remains low. If the input voltage ($V_I$) has dropped below the reference voltage ($V_R$) prior to receipt of the next reset pulse, the non-inverted output of the second latch-enabled comparator 425 is driven low and the inverted output is driven high upon receipt of the next reset pulse of the second reset pulse stream.

The summing circuit includes a fourth OR gate 415 having a first input communicatively coupled to the non-inverted output of the first latch-enabled comparator 420 and a second input communicatively coupled to the non-inverted output of the second latch-enabled comparator 425. The output of the fourth OR gate 415 is low if both the first and second trip signals are low. The output of the fourth OR gate 415 is high if one or both of the first and second trip signals are high. Thus, a pass/fail indicator is generated at an output of the fourth OR gate 415.

By summing the first and second trip signals to generate the pass/fail indicator, an overvoltage event is detected even if it occurs during a reset pulse of the first or second reset pulse stream. For example, if an overvoltage event occurs during a reset pulse of the first reset pulse stream, the first latch-enabled detector will not detect the event. However, each pulses of the second reset pulse stream is delayed (e.g., 50 ns) with respect to the corresponding pulse of the first reset stream. Therefore, the second latch-enabled comparator will detect the overvoltage event and latch its output at the high state, which in turn will result at a high output at the summing circuit.

The counter 410 includes a first input for receiving the clock signal (CLK). A count value representing a period of time is generated at an output of the counter 410. The storage module 405 includes a first input for receiving the count and a second input for receiving the pass/fail indicator. The storage module 405 stores the count whenever fail indicator (e.g., high voltage level) is received. Accordingly, the clock based voltage deviation detector 400 correlates an overvoltage event with a particular clock cycle.

Figure 4B:
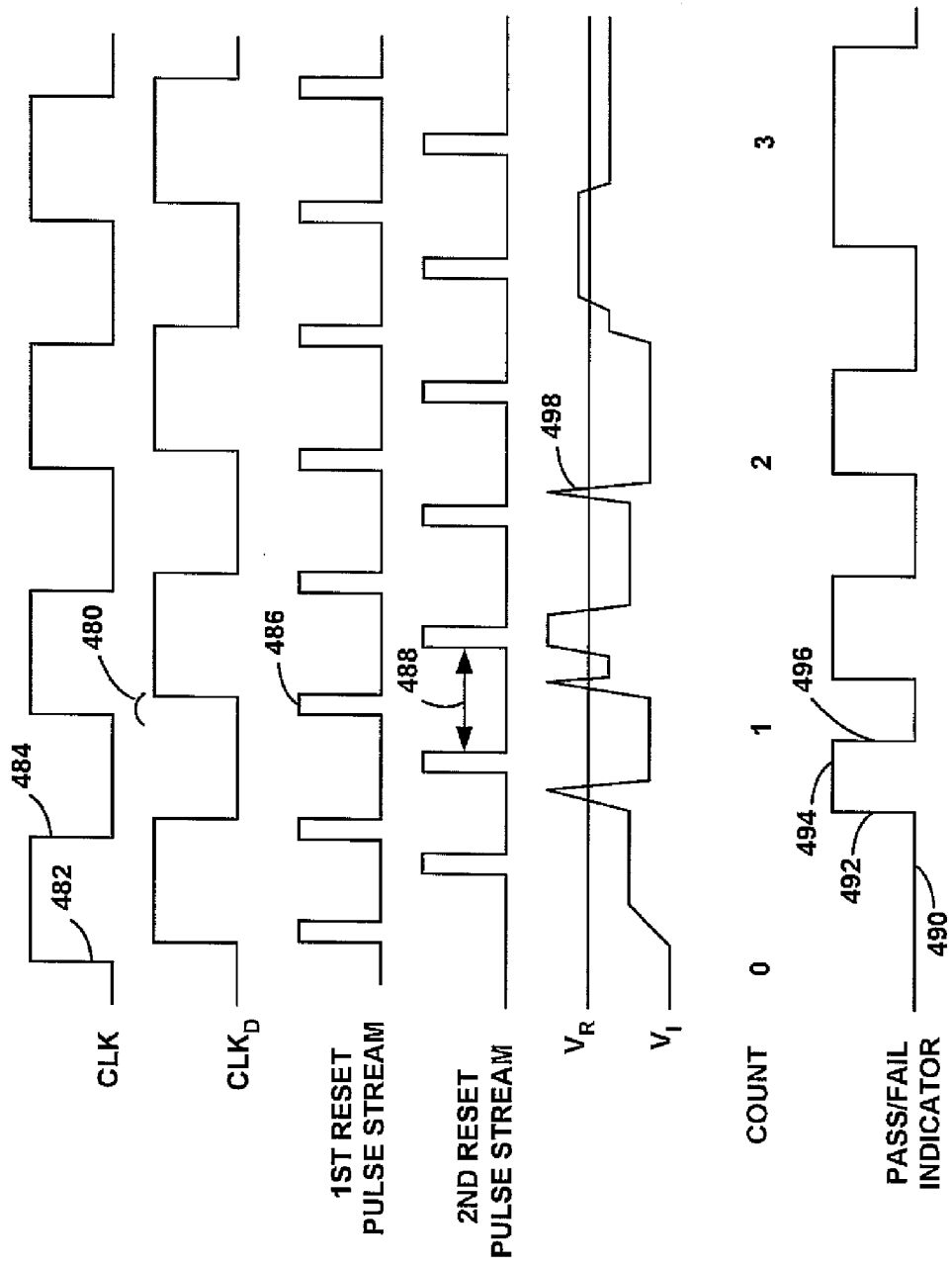
FIG. 4B shows a timing diagram illustrating operation of a clock based voltage deviation detector, in accordance with one embodiment of the present invention.

Referring now to FIG. 4B, a timing diagram illustrating operation of a clock based voltage deviation detector, in accordance with one embodiment of the present invention, is shown. As depicted in FIG. 4B the delayed clock signal ($CLK_D$) is shifted in time 480 with respect to the clock signal (CLK). The reset pulse stream is a series of pulses substantially aligned to the rising and falling edge 482, 484 of the clock signal (CLK). The width of each reset pulse 486 is substantially equal to the shift in time 480 between the clock signal (CLK) and the delayed clock signal ($CLK_D$). The delayed reset pulse stream is shifted in time 488 with respect to the reset pulse stream. The pass/fail indicator is at a first state 490 if the monitored voltage ($V_I$) is less than the reference voltage ($V_R$). The pass/fail indicator transitions 492 to a second state 494 when the monitored voltage ($V_I$) exceeds the reference voltage ($V_R$). The second state 494 is maintained (e.g., latched) until the monitored voltage ($V_I$) falls below the reference voltage ($V_R$) and a next result pulse or delayed reset pulse is detected. If the monitored voltage ($V_I$) falls below the reference voltage ($V_R$), the pass/fail indicator transitions 496 to the first state 490 after the next reset pulse or delayed reset pulse. It is appreciated that the second latch-enabled comparator detects an overvoltage 498 event that occurs during a reset pulse; while the first latch-enabled comparator detects an overvoltage event that occurs during a delayed reset pulse.

Accordingly, embodiments of the present invention enhance a basic voltage comparator to allow it to identify locations in time where a specified voltage event has occurred. Clock based voltage deviation detector, in accordance with embodiments of the present invention, may advantageously be utilized to detect and correlate overvoltage or undervoltage events in each clock cycle.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A clock based voltage deviation detector comprising:
   a pulse module having a pulse input for receiving a clock signal and a pulse output for outputting a stream of reset pulses, wherein said pulse module includes,
      a delay cell having a first delay input for receiving said clock signal and a delay output for outputting a delayed clock signal as a function of said clock signal; and
      an exclusive-OR gate having a first exclusive-OR input for receiving said clock signal, a second exclusive-OR input communicatively coupled to said delay output of said delay cell and an exclusive-OR output for outputting said stream of reset pulses as a function of said clock signal and said delayed clock signal;
   an indicator module having a first indicator input for receiving an input signal, a second indicator input for receiving a reference voltage, a third indicator input communicatively coupled to said pulse output of said pulse module and an indicator output for outputting a pass/fail indicator signal as a function of said stream of reset pulses and a difference between said input signal and said reference voltage; and
   a correlation module having a first correlation input for receiving said clock signal, a second correlation input communicatively coupled to said indicator output of said indicator module, wherein an event of said pass/fail indicator signal is correlated to a specific period of said clock signal at which said event occurred.

2. The clock based voltage deviation detector according to claim 1, wherein said correlation module comprises:
   a counter having a counter input for receiving said clock signal and a counter output for outputting a count value as a function of said clock signal; and
   a storage module having a first storage input communicatively coupled to said counter output and a second storage input for receiving said pass/fail indicator, wherein said count value corresponding to said event of said paid/fail indicator is stored.

3. The clock based voltage deviation detector according to claim 1, wherein said indicator module comprises:
   a comparator having a first comparator input for receiving said input signal, a second comparator input for receiving said reference voltage and a comparator output for outputting a trip signal as a function of a difference between said input signal and said reference voltage; and
   a latch having a first input communicatively coupled to said comparator output of said comparator, a second input communicatively coupled to said pulse output and a latch output for outputting said pass/fail indicator as a function of said trip signal and said stream of reset pulses.

4. The clock based voltage deviation detector according to claim 1, wherein said indicator module comprises a latch-enabled comparator having a first comparator input for receiving said input signal, a second comparator input for receiving said reference voltage, a third comparator input communicatively coupled to said pulse output of said pulse module and a comparator output for outputting said pass/fail indicator signal as a function of said stream of reset pulses and a difference between said input signal and said reference voltage.

5. A clock based voltage deviation detector comprising:
   a pulse module for generating a stream of reset pulses as a function of a clock signal;
   an indicator module for generating a pass/fail indicator signal as a function of said stream of reset pulses and a difference between an input voltage and a reference voltage;
   a counter for generating a count value as a function of said clock signal; and
   a storage module for saving a particular count value at which an event of said pass/fail signal occurs.

6. The clock based voltage deviation detector according to claim 5, wherein said pulse module comprises:
   an OR gate having an OR gate input for receiving said clock signal; and
   an exclusive-OR gate having first input for receiving said clock signal, a second input communicatively coupled to an OR gate output of said OR gate, and an output for outputting said stream of reset pulses.

7. The clock based voltage deviation detector according to claim 6, wherein said indicator module comprises a latch-enabled comparator having a first comparator input for receiving said input voltage a second comparator input for receiving said reference voltage, a third comparator input for receiving said stream of reset pulses, and a comparator output for outputting said pass/fail indicator signal.

8. The clock based voltage deviation detector according to claim 7, wherein:
   said first comparator input of said latch-enabled comparator comprises a non-inverting input;
   said second comparator input of said latch-enabled comparator comprises an inverting input;
   said third comparator input of said latch-enabled comparator comprises a latch enable input; and
   said event comprises an overvoltage.

9. The clock based voltage deviation detector according to claim 7, wherein:
   said first comparator input of said latch-enabled comparator comprises an inverting input;
   said second comparator input of said latch-enabled comparator comprises a non-inverting input;
   said third comparator input of said latch-enabled comparator comprises a latch enable input; and
   said event comprises an undervoltage.

10. A clock based voltage deviation detector comprising:
    a means for generating a reset pulse stream as a function of a clock signal;
    a means for generating a delayed reset pulse stream as a function of said clock signal;

a means for generating a pass/fail indicator signal as a function of said reset pulse stream, said delayed reset pulse stream and an event of a monitored voltage; and a means for correlating an event of said pass/fail indicator signal with a specific period of said clock signal at which said event occurred.

11. The clock based voltage deviation detector according to claim 10, wherein said means for generating a pass/fail indicator signal comprises:

a means for detecting said event of said monitored voltage and generating a first trip signal until receipt of a next pulse of said reset pulse stream;

a means for detecting said event of said monitored voltage and generating a second trip signal until receipt of a next pulse of said delayed reset pulse stream; and a means for generating said pass/fail indicator signal as a function of said first trip signal and said second trip signal.

12. The clock based voltage deviation detector according to claim 10, wherein said monitored voltage comprises an input voltage relative to a reference voltage.

* * * * *